US008836560B2

(12) United States Patent
Felder

(10) Patent No.: US 8,836,560 B2
(45) Date of Patent: Sep. 16, 2014

(54) DIGITAL TO ANALOG CONVERTERS WITH ADJUSTABLE OUTPUT RESOLUTION

(71) Applicant: Maxim Integrated Products, Inc., San Jose, CA (US)

(72) Inventor: Matthew Felder, Austin, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 6 days.

(21) Appl. No.: 13/705,924

(22) Filed: Dec. 5, 2012

(65) Prior Publication Data

US 2014/0152479 A1 Jun. 5, 2014

(51) Int. Cl.
*H03M 1/66* (2006.01)
*H03M 1/74* (2006.01)

(52) U.S. Cl.
CPC ............... *H03M 1/66* (2013.01); *H03M 1/745* (2013.01); *H03M 1/742* (2013.01)
USPC ............ 341/144; 341/135; 341/145; 341/153

(58) Field of Classification Search
CPC ....... H03M 1/747; H03M 1/745; H03M 1/76; H03M 1/0682; H03M 1/66
USPC .................................. 341/134, 135, 144–154
See application file for complete search history.

(56) References Cited

U.S. PATENT DOCUMENTS

| | | | | |
|---|---|---|---|---|
| 5,939,991 A * | 8/1999 | Deng | ............................ | 340/638 |
| 6,204,789 B1 * | 3/2001 | Nagata | ........................... | 341/144 |
| 6,501,402 B2 * | 12/2002 | Boxho | .......................... | 341/120 |
| 6,593,868 B2 * | 7/2003 | Clara et al. | ...................... | 341/144 |
| 6,853,323 B1 * | 2/2005 | Chen et al. | ..................... | 341/144 |
| 7,535,396 B1 * | 5/2009 | Melanson | ...................... | 341/144 |
| 7,956,782 B2 * | 6/2011 | Werking | ........................ | 341/143 |
| 8,081,099 B2 * | 12/2011 | Ikoma et al. | ................... | 341/144 |
| 8,193,960 B2 * | 6/2012 | Kuramochi | .................... | 341/144 |
| 8,456,341 B2 * | 6/2013 | Hezar et al. | .................... | 341/144 |
| 8,519,877 B1 * | 8/2013 | Baranwal | ...................... | 341/144 |
| 2012/0306678 A1 * | 12/2012 | Hezar et al. | .................... | 341/146 |
| 2013/0099950 A9 * | 4/2013 | Amemiya et al. | ............ | 341/144 |
| 2013/0141266 A1 * | 6/2013 | Kuramochi | .................... | 341/144 |

OTHER PUBLICATIONS

Doorn, T.S., et al., "An audio FIR-DAC in a BCD process for high power Class-D amplifiers," Proceedings of ESSCIRC, Grenoble, France, (2005), pp. 459-462.
Felder, Matt, et al., "Analyzing audio DAC jitter sensitivity" (Sep. 29, 2012). Retrieved Apr. 18, 2014, from http://www.edn.com/Home/PrintView?contentItemId=4397389; 9 pages.
Felder, Matt et al., "Digital-Input Class D amplifiers expand the benefits of traditional Class D and simplify system design" (Nov. 3, 2012). Retrieved Apr. 18, 2014, from http://www.edn.com/Home/PrintView?contentItemId=4400490; 6 pages.

* cited by examiner

*Primary Examiner* — Linh Nguyen

(57) ABSTRACT

A digital to analog converter (DAC) includes: first and second nodes; a first switching device; a second switching device; and a switch control module. The switch control module selectively configures the first and second switching devices such that: in a first configuration, the first switching device connects a first current to the first node and the second switching device connects a second current to the second node; in a second configuration, the first switching device connects the first current to the second node and the second switching device connects the second current to the first node; and in a third configuration, the first and second switching devices disconnect the first current and the second current from the first and second nodes.

22 Claims, 5 Drawing Sheets

DIGITAL TO ANALOG CONVERTERS WITH ADJUSTABLE OUTPUT RESOLUTION

FIELD

The present disclosure relates to digital to analog converters (DACs) and more particularly to 1 and 1.5 bit DACs.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Various types of electronic circuits use analog and digital signals. An analog to digital converter (ADC) may be implemented to convert an analog signal into a digital signal that can be used by one or more digital components. A digital to analog converter (DAC) may be implemented to convert a digital signal into an analog signal that can be used by one or more analog components.

For example, a portable device that outputs sound ("a portable audio device") includes a DAC. The DAC receives a digital signal that is, for example, pulse density modulated (PDM) or pulse code modulated (PCM). The DAC generates an analog signal based on the digital signal. An amplifier drives one or more speakers of the portable audio device based on the analog signal to produce sound.

SUMMARY

In a feature, a digital to analog converter (DAC) includes: first and second nodes; a first switching device; a second switching device; and a switch control module. Based on a first set of one or two binary bits, the switch control module configures the first and second switching devices such that the first switching device connects a first current to the first node and the second switching device connects a second current to the second node. Based on a second set of one or two binary bits, the switch control module configures the first and second switching devices such that the first switching device connects the first current to the second node and the second switching device connects the second current to the first node. Based on a third set of one or two binary bits, the switch control module configures the first and second switching devices such that the first and second switching devices disconnect the first current and the second current from the first and second nodes.

In other features, the DAC further includes: a third switching device; a fourth switching device; and a second switch control module. The second switch control module: selectively configures the third and fourth switching devices such that the third switching device connects a third current to the first node and the fourth switching device connects a fourth current to the second node; selectively configures the third and fourth switching devices such that the third switching device connects the third current to the second node and the fourth switching device connects the fourth current to the first node; and selectively configures the third and fourth switching devices such that the third and fourth switching devices disconnect the third and fourth currents from the first and second nodes.

In still other features, the DAC further includes at least one of: a tap current module that generates the first current based on a first reference voltage; and a sink current module that generates the second current based on a second reference voltage.

In yet other features, the first and second currents are substantially equal in magnitude and opposite in polarity.

In other features, the DAC further includes: a current source reference generator module that generates the first reference voltage based on a target current; a current sink reference generator module that generates the second reference voltage based on the target current; and a conversion control module that sets the target current based on a digital signal input to the DAC.

In still other features, the conversion control module sets the target current to a first predetermined current when the digital signal is a 1 bit signal and sets the target current to a second predetermined current in response to a determination that the digital signal is a 1.5 bit signal.

In yet other features, the conversion control module determines that the digital signal is a 1.5 bit signal in response to a determination that the digital signal includes a predetermined pattern of binary bits.

In still other features, the second predetermined current is less than the first predetermined current.

In further features, a system includes: the DAC; a differential amplifier that includes a first input that is connected to the first node, that includes a second input that is connected to the second node, and that includes first and second outputs; a first resistance that is connected between the first input and the first output; and a second resistance that is connected between the second input and the second output.

In other features, the system further includes a conversion control module that selectively varies the first and second resistances based on a digital signal input to the DAC.

In yet other features, the conversion control module sets the first and second resistances to a first predetermined value when the digital signal is a 1 bit signal and sets the first and second resistances to a second predetermined value in response to a determination that the digital signal is a 1.5 bit signal.

In still other features, the second predetermined value is less than the first predetermined value.

In other features, a digital to analog converter (DAC) includes: first and second nodes; a first switching device that receives a first current at a first terminal and that is connected to the second node at a second terminal; a second switching device that is connected to a second current at a first terminal and that is connected to the second node at a second terminal; a third switching device that receives the first current at a first terminal and that is connected to the first node at a second terminal; a fourth switching device that is connected to the second current at a first terminal and that is connected to the first node at a second terminal; a fifth switching device that receives the first current at a first terminal; a sixth switching device that is connected at a second terminal to a second terminal of the fifth switching device and that is connected to the second current at a first terminal; and a switch control module. Based on first and second bits of binary data, the switch control module: generates a first signal that is applied to control terminals of the first and fourth switching devices; generates a second signal that is applied to control terminals of the second and third switching devices; and generates a third signal that is applied to control terminals of the fifth and sixth switching devices.

In other features, the DAC further includes: a seventh switching device that receives a third current at a first terminal and that is connected to the second node at a second terminal; an eighth switching device that is connected to a fourth current at a first terminal and that is connected to the second node at a second terminal; a ninth switching device that receives the third current at a first terminal and that is connected to the first node at a second terminal; a tenth switching device that is connected to the fourth current at a first terminal and that is connected to the first node at a second terminal; an eleventh switching device that receives the third current at a first terminal; a twelfth switching device that is connected at a second terminal to a second terminal of the eleventh switching device and that is connected to the fourth sink at a first terminal; and a second switch control module. Based on third and fourth bits of binary data, the second switch control module: generates a fourth signal that is applied to control terminals of the seventh and tenth switching devices; generates a fifth signal that is applied to control terminals of the eighth and ninth switching devices; and generates a sixth signal that is applied to control terminals of the eleventh and twelfth switching devices.

In yet other features, the switch control module includes a first flip flop, a second flip flop, and a first logic gate that generate the first, second, and third signals. The second switch control module includes a third flip flop, a fourth flip flop, and a second logic gate that generate the fourth, fifth, and sixth signals.

In still other features: an input of the third flip flop is connected to an output of a first one of the first and second flip flops; an input of the fourth flip flop is connected to an output of a second one of the first and second flip flops; and the first and second ones are different.

In other features, the first, second, third, fourth, fifth, and sixth switching devices are metal-oxide semiconductor field-effect transistors (MOSFETs).

In still other features, a system includes: the DAC; a differential amplifier that includes a first input that is connected to the first node, that includes a second input that is connected to the second node, and that includes first and second outputs; a first resistance that is connected between the first input and the first output; and a second resistance that is connected between the second input and the second output.

In yet other features, the system further includes a conversion control module that sets the first and second resistances to a first predetermined value when a digital signal input to the DAC is a 1 bit signal and that sets the first and second resistances to a second predetermined value in response to a determination that the digital signal is a 1.5 bit signal.

In other features, a system includes: the DAC; a tap current module that generates the first current based on a first reference voltage; a sink current module that generates the second current based on a second reference voltage; a current source reference generator module that generates the first reference voltage based on a target current; a current sink reference generator module that generates the second reference voltage based on the target current; and a conversion control module that sets the target current to a first predetermined current when a digital signal input to the DAC is a 1 bit signal and sets the target current to a second predetermined current in response to a determination that the digital signal is a 1.5 bit signal.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

A digital to analog converter (DAC) includes a plurality of individual finite impulse response (FIR) taps. Each of the taps receives a respective tap current. Based on one or more binary data bits from a digital signal that are input to a given tap, the tap controls its output. For example, for a single bit DAC, a tap receives a binary data bit from the digital signal. Based on the binary data bit, the tap connects the tap current with a first output or a second output of the DAC. The tap may, for example, connect the tap current to the first output when the binary data bit is a 1 and connect the tap current to the second output when the binary data bit is a 0. However, the tap current (and a current sink, if implemented) may include noise. As such, the DAC outputs noise when the tap current (and/or a current sink) is connected to the first output or the second output.

The present disclosure describes a 1.5 bit DAC. Based on two binary bits of data, each of the taps of the DAC connects a respective tap current to the first output, connects the respective tap current to the second output, or disconnects the respective tap current from the first and second outputs. The ability to disconnect the tap currents (and a current sink) from the first and second outputs decreases noise relative to 1 bit operation. However, the 1.5 bit DAC is able to operate based on both 1.5 bit digital inputs and 1 bit digital inputs.

Figure 1:
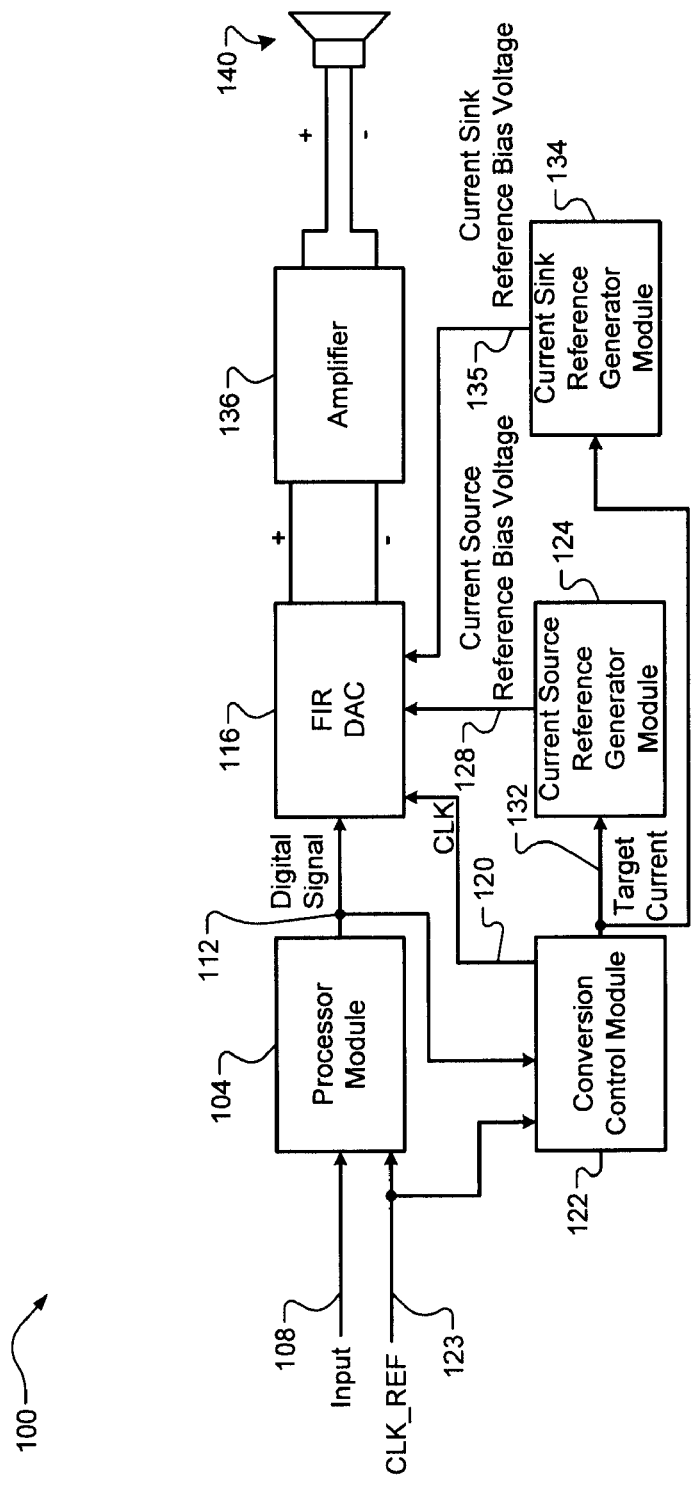
FIG. 1 is a functional block diagram of an example portion of a portable audio device according to the present disclosure.

Referring now to FIG. 1, a functional block diagram of a portion of an example portable audio device 100 is presented. A processor module 104 receives an input signal 108 and modulates the input signal 108 to generate a digital signal 112. The input signal 108 may be generated, for example, based on an audio file stored in a non-transitory tangible computer readable medium.

The processor module 104 may generate the digital signal 112 based on the input signal 108 and a reference clock signal 123, for example, using pulse density modulation (PDM), pulse code modulation (PCM), or another suitable type of Sigma-Delta (ΣΔ) digitization. The processor module 104 outputs the digital signal 112 to a finite impulse response (FIR) digital to analog converter (DAC) 116. A conversion control module 122 may generate a clock (CLK) signal 120 that is used by the DAC 116 to convert the digital signal 112 into an analog output. The clock signal 120 may be generated based on the reference clock signal 123 that is input to the DAC 116. While the conversion control module 122 is shown as being external to the processor module 104 and the DAC 116, the conversion control module 122 may be implemented within the processor module 104, within the DAC 116, or, as shown, independently.

A current source reference generator module 124 provides a current source reference bias voltage 128 to the DAC 116. The current source reference generator module 124 generates the current source reference bias voltage 128 based on a target current 132. A current sink reference generator module 134 provides a current sink reference bias voltage 135 to the DAC 116. The current sink reference generator module 134 generates the current sink reference bias voltage 135 based on the target current 132. In various implementations, the current sink reference generator module 134 or the current source reference generator module 124 may be omitted.

Based on the digital signal 112 and the clock signal 120, the DAC 116 generates an (analog) output that is applied to an amplifier 136, such as a transresistance amplifier. The amplifier 136 may drive one or more speakers, such as speaker 140, based on the output of the DAC 116. While the DAC 116 is shown and discussed in conjunction with the example portable audio device 100, the DAC 116 may also be included in other types of devices, such as ultrasonic devices, gyroscopic devices, noise-cancellation devices, and various other types of devices.

The DAC 116 parses the digital signal 112 into sets of binary bits based on the clock signal 120. For example, edges of the clock signal 120 may define sets of 1 binary (base-2) bit of digital data or sets of 2 binary bits of digital data. The DAC 116 generates the output based on the sets of binary bits.

The DAC 116 operates in a 1 bit mode when the digital signal 112 is a 1 bit signal. When operating in 1 bit mode, the DAC 116 generates the output based on sets of single bits of digital data conveyed by the digital signal 112. The DAC 116 can also operate in 1.5 bit mode when the digital signal 112 is a 1.5 bit signal. When operating in the 1.5 bit mode, the DAC 116 generates the output based on sets of two bits of digital data conveyed by the digital signal 112.

Figure 2:
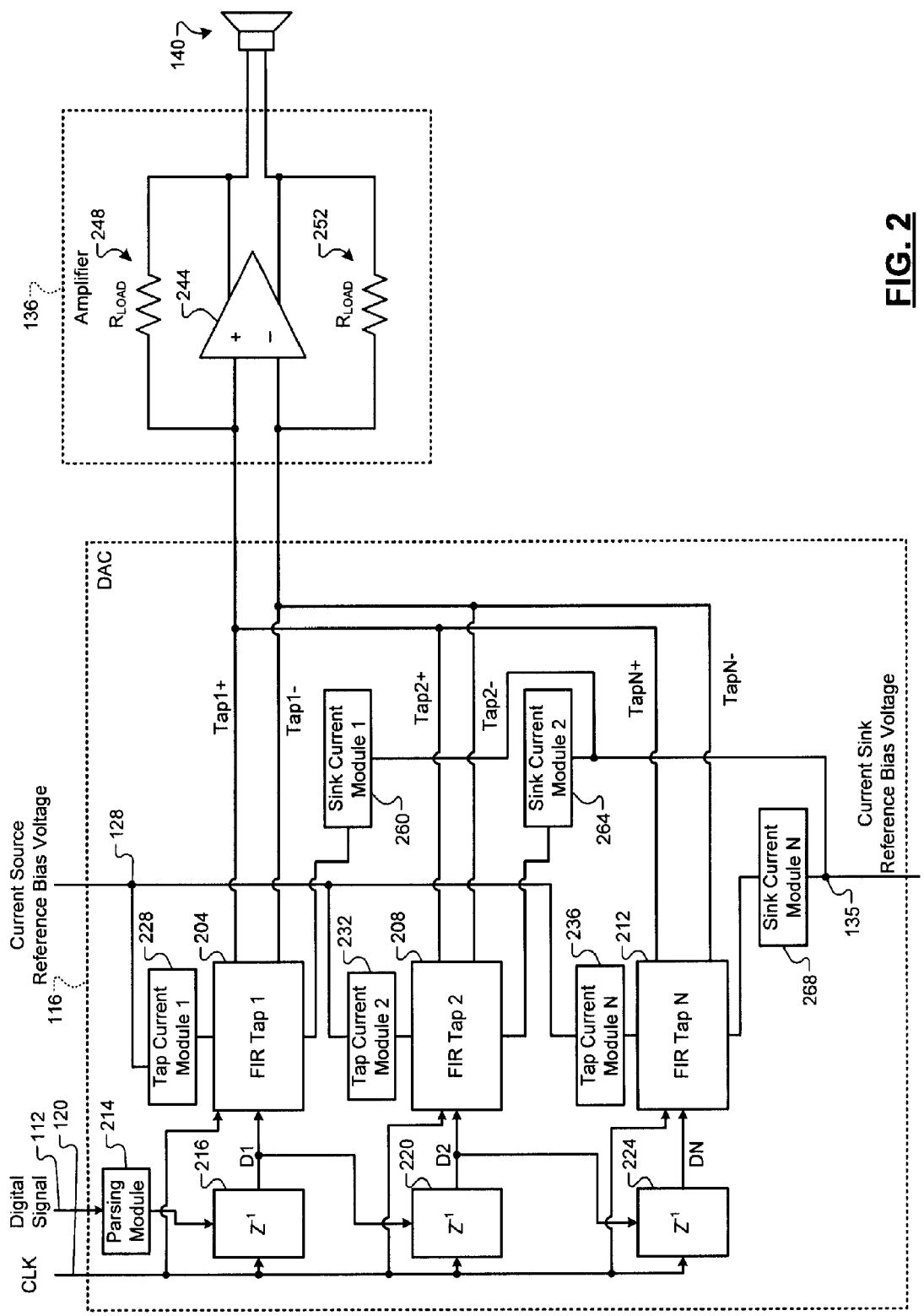
FIG. 2 is a functional block diagram of an example finite impulse response (FIR) digital to analog converter (DAC) according to the present disclosure.

Referring now to FIG. 2, a functional block diagram including example implementations of the DAC 116 and the amplifier 136 are presented. The DAC 116 includes N FIR taps, such as a first FIR tap 204, a second FIR tap 208, . . . , and an N-th FIR tap 212. While three FIR taps are shown and discussed, N is an integer greater than or equal to 2. For example only, N may be equal to 32, 60, 72, or another suitable integer that is greater than or equal to 2.

The DAC 116 also includes a parsing module 214 that receives the digital signal 112 and the clock signal 120. The parsing module 214 generates sets of two binary bits of data based on the digital signal 112. For example, during 1.5 bit operation, the parsing module 214 generates two bits of binary data based on two bits of binary data conveyed by the digital signal 112 during a cycle of the clock signal 120.

When the digital signal 112 is a 1 bit signal, the parsing module 214 may set the two bits based on the 1 binary bit of data conveyed during a cycle of the clock signal 120. For example, when the 1 bit is a 1, the parsing module 214 may set one of the two bits to a 1 and the other of the two bits to a 0, and the parsing module 214 may set one of the two bits to a 0 and the other of the two bits to a 1 when the 1 bit is a zero. Other possible combinations of the two bits could alternatively be used based on the configuration of the FIR taps.

The DAC 116 also includes N one-unit delay buffers (illustrated using Z-notation), such as first delay buffer 216, second delay buffer 220, . . . , and N-th delay buffer 224. Each of the one-unit delay buffers receives the clock signal 120. The first delay buffer 216 stores 1 or 2 binary bits of data input to it by the parsing module 214 during a cycle of the clock signal 120. During that cycle of the clock signal 120, the first delay buffer 216 outputs the 1 or 2 binary bits of data received during the last cycle of the clock signal 120. During the next cycle of the clock signal 120, the first delay buffer 216 outputs the 1 or 2 binary bits of data received during that cycle of the clock signal 120.

The second delay buffer 220 stores the binary bit(s) output by the first delay buffer 216 during a cycle of the clock signal 120 and outputs the binary bit(s) during the next cycle of the clock signal 120. The N-th delay buffer 224 stores the binary bit(s) output by the N−1th delay buffer (e.g., the second delay buffer 220 as shown) during a cycle of the clock signal 120 and outputs the binary bit(s) during the next cycle of the clock signal 120.

The DAC 116 also includes N tap current modules, such as first tap current module 228, second tap current module 232, . . . , and N-th tap current module 236. The N tap current modules provide N scaled tap currents to the N FIR taps, respectively, based on the current source reference bias voltage 128. For example, the first tap current module 228 produces a first tap current (Tap Current 1) using the current source reference bias voltage 128 and provides the first tap current to the first FIR tap 204. The second tap current module 232 produces a second tap current (Tap Current 2) using the current source reference bias voltage 128 and provides the second tap current to the second FIR tap 208. The N-th tap current module 236 produce an N-th tap current (Tap Current N) using the current source reference bias voltage 128 and provides the N-th tap current to the N-th FIR tap 212. The N tap currents can be increased or decreased, for example, by changing the current source reference bias voltage 128.

The N tap current modules are configured to each provide a predetermined current (i.e., the tap currents) that is scaled relative to the target current 132 of FIG. 1. While the N tap current modules are shown as being external to the N FIR taps, the N tap current modules may be implemented within the N FIR taps, respectively.

The DAC 116 also includes N sink current modules, such as first sink current module 260, second sink current module 264, . . . , and N-th sink current module 268. The N sink current modules provide N scaled sink currents to the N FIR taps, respectively, based on the current sink reference bias voltage 135. For example, the first sink current module 260 produces a first sink current using the current sink reference bias voltage 135 and provides the first sink current to the first FIR tap 204. The second sink current module 264 produces a second sink current using the current sink reference bias voltage 135 and provides the second sink current to the second FIR tap 208. The N-th sink current module 268 produce an N-th sink current using the current sink reference bias voltage and provides the N-th sink current to the N-th FIR tap 212.

The N sink current modules are configured to each provide a predetermined current (i.e., the sink currents) that is scaled relative to the target current 132 of FIG. 1. While the N sink current modules are shown as being external to the N FIR taps, the N sink current modules may be implemented within the N FIR taps, respectively. The N sink current modules may be configured to produce the N sink currents such that the N sink currents are substantially equal and opposite (in polarity) to the N tap currents, respectively. The N sink currents can be increased or decreased, for example, by changing the current sink reference bias voltage 135. While the N sink current modules are shown as being external to the N FIR taps, the N sink current modules may be implemented within the N FIR taps, respectively.

The N FIR taps generate N outputs based on the binary bit(s) input to the N FIR taps, respectively. The N outputs of the N FIR taps are connected in parallel and applied to the amplifier 136. The amplifier 136 may be a transresistance amplifier and include an amplifier 244 (e.g., a differential amplifier) and first and second load resistances 248 and 252. Transresistance amplifiers may also be referred to as transimpedance amplifiers.

The first load resistance 248 may be connected to a positive input of the amplifier 244 and to a first output (e.g., a negative output) of the amplifier 244. The second load resistance 252 may be connected to a negative input of the amplifier 244 and to a second output (e.g., a positive output) of the amplifier 244. The resistances of the first and second load resistances 248 and 252 may be equal for linearity. The first and second load resistances 248 and 252 may be fixed value resistors or variable resistors.

Figure 3:
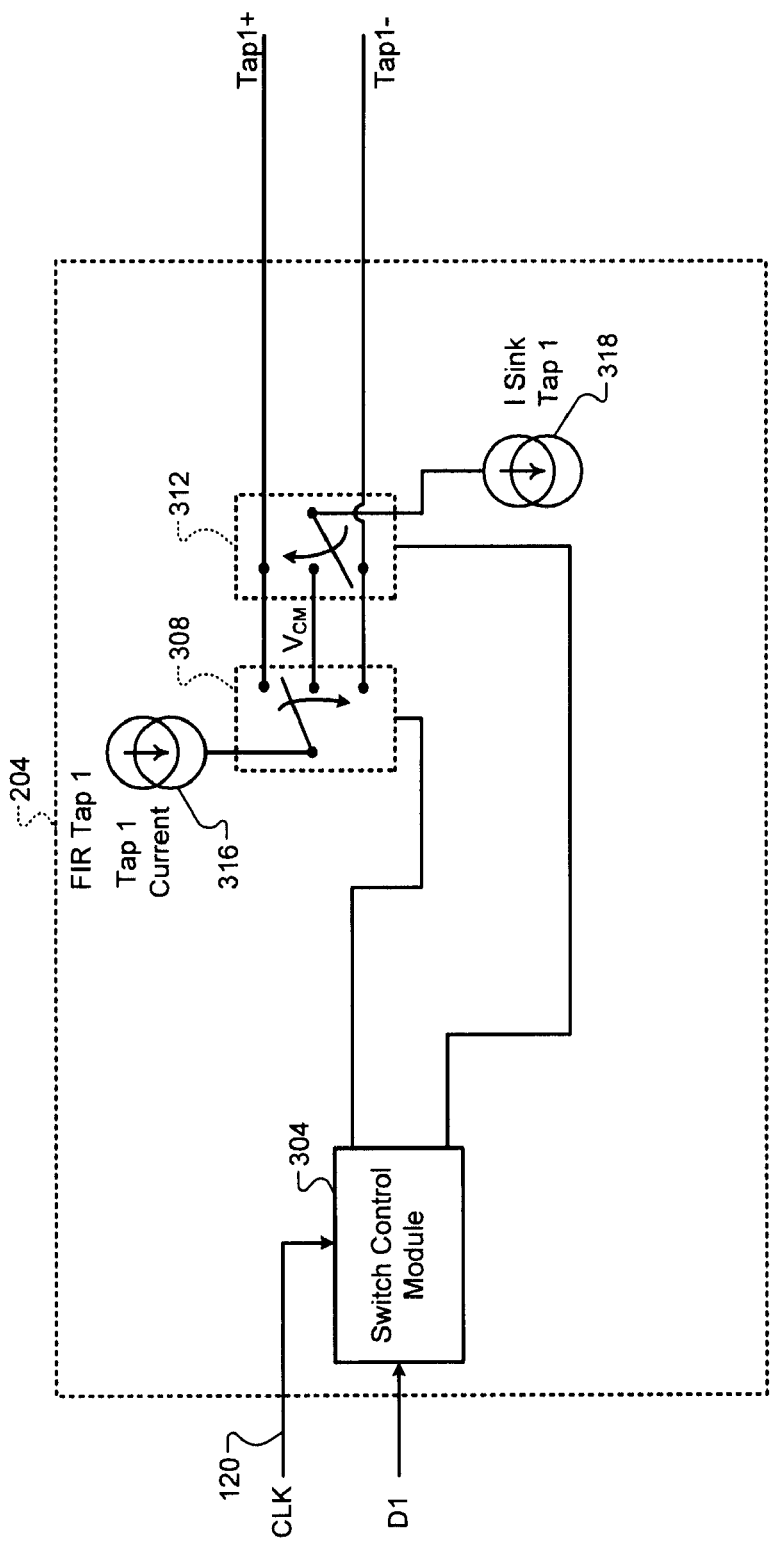
FIG. 3 is a functional block diagram of an example one of N FIR taps of the FIR DAC according to the present disclosure.

Referring now to FIG. 3, a functional block diagram of an example implementation of the first FIR tap 204 of the DAC 116 is presented. A switch control module 304 controls first and second switching modules 308 and 312 based on the binary bit(s) input to the switch control module 304. The first and second switching modules 308 and 312 each include one or more switching devices.

The first switching module 308 includes a first terminal and receives the first tap current 316 at the first terminal. The first switching module 308 also includes second, third, and fourth terminals. Based on the binary bit(s) input to the switch control module 304, the switch control module 304 controls whether the first terminal is connected to the second terminal, the third terminal, or the fourth terminal.

The second switching module 312 also includes a first terminal, and the first sink current 318 is connected to the first terminal of the second switching module 312. The second switching module 312 also includes second, third and fourth terminals. The second, third, and fourth terminals of the second switching module 312 may be connected to the second, third, and fourth terminals of the first switching module 308. Based on the binary bit(s) input to the switch control module 304, the switch control module 304 also controls whether the first terminal of the second switching module 312 is connected the second terminal, the third terminal, or the fourth terminal of the second switching module 312.

The digital data input to the switch control module 304 includes 2 binary bits. When the digital signal 112 is a 1 bit signal, the parsing module 214 sets the 2 binary bits based on the state of the 1 bit conveyed during a cycle of the clock signal 120. When the digital signal 112 is a 1.5 bit signal, the parsing module 214 sets the 2 binary bits based on the 2 binary bits of data conveyed during a cycle of the clock signal 120.

2 binary bits can have 4 possible combinations: (0,0), (0,1), (1,0), and (1,1). However, only 3 of the 4 possible combinations are needed for 1.5 bit operation. One of the (4) possible combinations can therefore be considered invalid, such as (1,1) for example.

When 2 binary bits are input to the switch control module 304, the switch control module 304 controls the first and second switching modules 308 and 312 based on the 2 binary bits. For example, when (0,1) is input to the switch control module 304, the switch control module 304 may connect the first terminal of the first switching module 308 to the second terminal of the first switching module 308 and connect the first terminal of the second switching module 312 to the fourth terminal of the second switching module 312. In this manner, the first tap current 316 is connected to the positive output of the first FIR tap 204, and the first sink current 318 is connected to the negative output of the first FIR tap 204. In this configuration, the first FIR tap 204 provides a first discrete output. The outputs of the N FIR taps are summed to produce the output of the DAC 116.

When (1,0) is input to the switch control module 304, the switch control module 304 may connect the first terminal of the first switching module 308 to the fourth terminal of the first switching module 308 and connect the first terminal of the second switching module 312 to the second terminal of the second switching module 312. In this manner, the first tap current 316 is connected to the negative output of the first FIR tap 204 and the first sink current 318 is connected to the positive output of the first FIR tap 204. In this configuration, the first FIR tap 204 provides a second discrete output that is different than the first. For example only, when the first tap current 316 and the first sink current 318 are substantially equal and opposite, the second discrete output may be substantially and opposite to the first discrete output.

When (0,0) is input to the switch control module 304, the switch control module 304 may connect the first terminal of the first switching module 308 to the third terminal of the first switching module 308 and connect the first terminal of the second switching module 312 to the third terminal of the second switching module 312. In this manner, both the first tap current 316 and the first sink current 318 are disconnected from the outputs of the first FIR tap 204. In this configuration, the first FIR tap 204 provides a third discrete output that is different than the second and the first. The third discrete output may be approximately equal to an average of the first and second discrete outputs.

The ability of the first FIR tap 204 to output three discrete outputs enables 1.5 bit operation of the DAC 116. Additionally, as the third discrete output may be approximately equal to an average of the first and second discrete outputs, 1.5 bit operation of the DAC 116 will inherently be linear. While examples of states of the first and second switching modules 308 and 312 have been provided for the 4 possible combinations of 2 binary bits, different mappings of 2 bit binary data to states of the first and second switching modules 308 and 312 may be used.

When 1 bit data is input to the switch control module 304, the switch control module 304 controls the first and second switching modules 308 and 312 based on the 1 bit data. For example, when the binary bit is a 1, the switch control module 304 may connect the first terminal of the first switching module 308 to the second terminal of the first switching module 308 and connect the first terminal of the second switching module 312 to the fourth terminal of the second switching module 312. In this manner, the first tap current 316 is connected to the positive output of the first FIR tap 204, and the first sink current 318 is connected to the negative output of the first FIR tap 204. In this configuration, the first FIR tap 204 provides the first discrete output.

When a 0 is input to the switch control module 304, the switch control module 304 may connect the first terminal of the first switching module 308 to the fourth terminal of the first switching module 308 and connect the first terminal of the second switching module 312 to the second terminal of the second switching module 312. In this manner, the first tap current 316 is connected to the negative output of the first FIR tap 204 and the first sink current 318 is connected to the positive output of the first FIR tap 204. In this configuration, the first FIR tap 204 provides the second discrete output that is different than the first.

The third terminals of the first and second switching modules 308 and 312 are not used when 1 bit data is input to the switch control module 304. In other words, the third terminals of the first and second switching modules 308 and 312 are not used during 1 bit operation.

The ability of the first FIR tap 204 to produce three discrete outputs levels (i.e., 1.5 bit operation) provides a higher output resolution than 1 bit operation where only two discrete output levels are used. Additionally, the ability to disconnect the first tap current 316 and the first sink current 318 from the outputs of the first FIR tap 204 may reduce noise output during 1.5 bit operation relative to 1 bit operation. For example only, the noise output reduction may be at least 3 decibels (dB). However, the DAC 116 still supports use of 1 bit signals.

While only the first FIR tap 204 is shown and discussed, the others of the N FIR taps may be similar or identical to the first FIR tap 204. The tap currents input to the others of the N FIR taps, however, may or may not be different than the first tap current and/or different than other tap currents.

Figure 4:
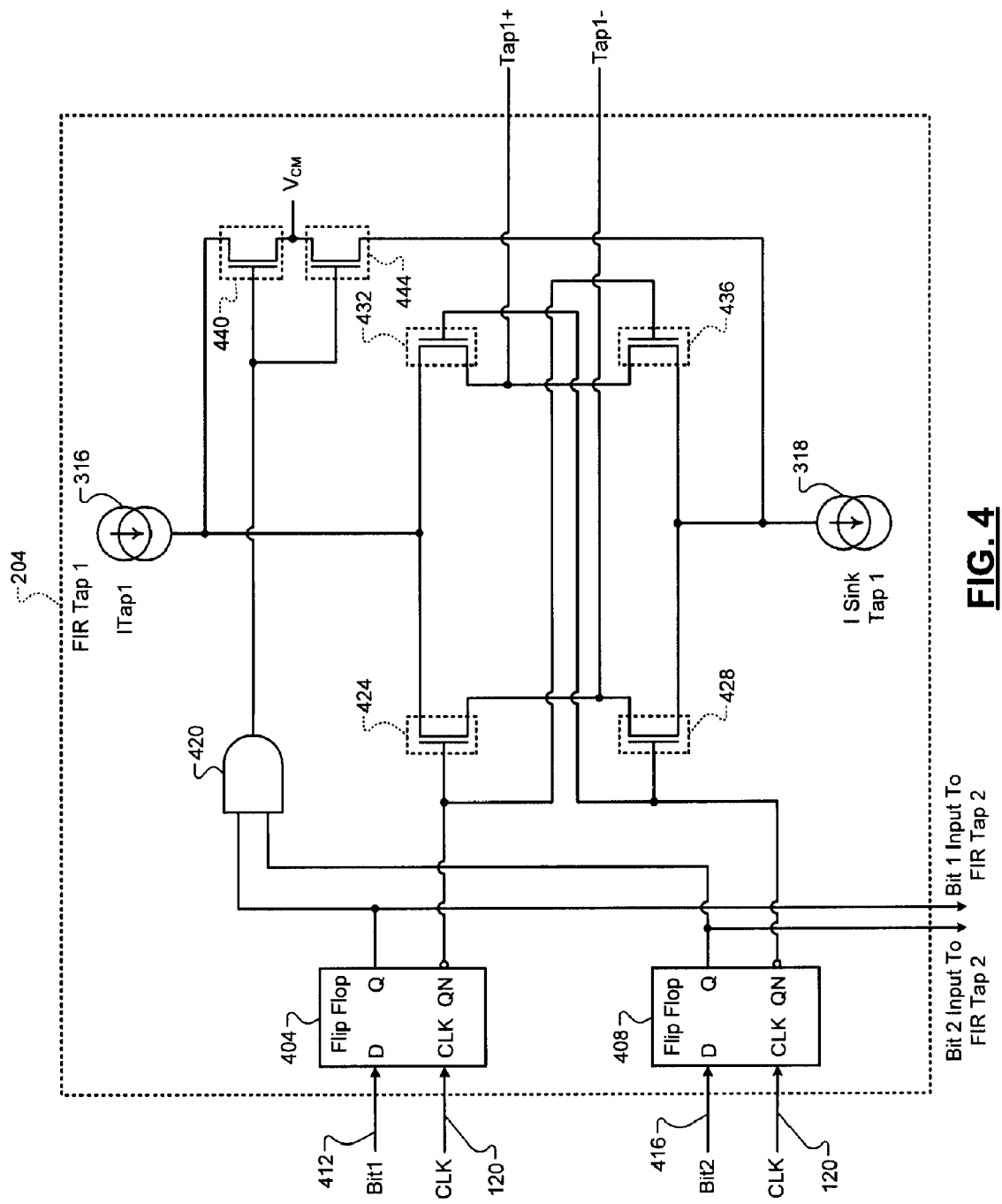
FIGS. 4 and 5 are functional block diagrams of examples of one of N FIR taps of the FIR DAC according to the present disclosure.

Referring now to FIG. 4, a functional block diagram of an example of the first FIR tap 204 of the DAC 116 is presented. The first FIR tap 204 may include first and second clocked, D-type flip flops 404 and 408. The first flip flop 404 receives a first binary bit (Bit1) 412 from the digital signal 112 at an input (D). The second flip flop 408 receives a second binary bit (Bit2) 416 from the digital signal 112 at an input (D). The first and second flip flops 404 and 408 provide the functionality of the first delay buffer 216. While the first and second flip flops 404 and 408 are shown as being implemented within the first FIR tap 204, the first and second flip flops 404 and 408 may be implemented externally to the first FIR tap 204, for example, as shown in FIG. 2.

In response to a leading edge of the clock signal 120, the first flip flop 404 sets a first (non-inverting) output (Q) to the state of the first binary bit 412. The first flip flop 404 also sets a second (inverting) output (QN or Q not) to the opposite state of the first binary bit 412. For example, the first flip flop 404 sets the second output to 0 when the first binary bit 412 is a 1 and sets the second output to 1 when the first binary bit 412 is a 0. The first flip flop 404 maintains the states of the first and second outputs until the next leading edge of the clock signal 120, at which time the first flip flop 404 updates the states of the first and second outputs to the state of the first binary bit 412. While use of leading edges is discussed, falling edges or a combination of leading and falling edges may be used.

In response to a leading edge of the clock signal 120, the second flip flop 408 sets a first (non-inverting) output (Q) to the state of the second binary bit 416. The second flip flop 408 also sets a second (inverting) output (QN or Q not) to the opposite state of the second binary bit 416. For example, the second flip flop 408 sets the second output to 0 when the second binary bit 416 is a 1 and sets the second output to 1 when the second binary bit 416 is a 0. The second flip flop 408 maintains the states of the first and second outputs until the next leading edge of the clock signal 120, at which time the second flip flop 408 updates the states of the first and second outputs to the state of the second binary bit 416.

The first FIR tap 204 may also include an AND gate 420 and first, second, third, fourth, fifth, and sixth switches 424, 428, 432, 436, 440, and 444. The first, second, third, fourth, fifth, and sixth switches 424-444 each include a first terminal (e.g., source), a second terminal (e.g., drain), and a control terminal (e.g., gate). For example only, the first, second, third, fourth, fifth, and sixth switches 424-444 may be N-channel, depletion type, or metal-oxide semiconductor field-effect transistors (MOSFETs). The first, second, third, fourth, fifth, and sixth switches 424-444 may alternatively be another suitable type of switch, such as P-channel MOSFETS (see FIG. 5), enhancement type MOSFETs, another type of FET, or one or more other suitable types of switching devices. If other types of switches are used, corresponding changes to the circuit may be necessary.

The control terminals of the first and fourth switches 424 and 436 are connected to the second output of the first flip flop 404. The control terminals of the second and third switches 428 and 432 are connected to the second output of the second flip flop 408.

The second terminals of the first and second switches 424 and 428 are connected to the negative output of the first FIR tap 204. The first terminal of the first switch 424 is connected to the first tap current 316, and the first terminal of the second switch 428 is connected to the first sink current 318. The second terminals of the third and fourth switches 432 and 436 are connected to the positive output of the first FIR tap 204. The first terminal of the third switch 432 is connected to the first tap current 316, and the first terminal of the fourth switch 436 is connected to the first sink current 318.

The first outputs of the first and second flip flops 404 and 408 are connected to first and second inputs of the AND gate 420. The output of the AND gate 420 is connected to the control terminals of the fifth and sixth switches 440 and 444. The second terminals of the fifth and sixth switches 440 and 444 are connected such that a common mode voltage ($V_{CM}$) is present at the second terminals of the fifth and sixth switches 440 and 444. The first terminal of the fifth switch 440 is connected to the first tap current 316, and the first terminal of the sixth switch 444 is connected to the first sink current 318.

Comparing the example of FIG. 3 with the example of FIG. 4, the switch control module 304 may include the first and second flip flops 404 and 408 and the AND gate 420. The first switching module 308 may include the first switch 424, the third switch 432, and the fifth switch 440. The second switching module 312 may include the second switch 428, the fourth switch 436, and the sixth switch 444. As noted above, the first and second flip flops 404 and 408 are also shown as being implemented within the first FIR tap 204 in the example of FIG. 4.

Figure 5:
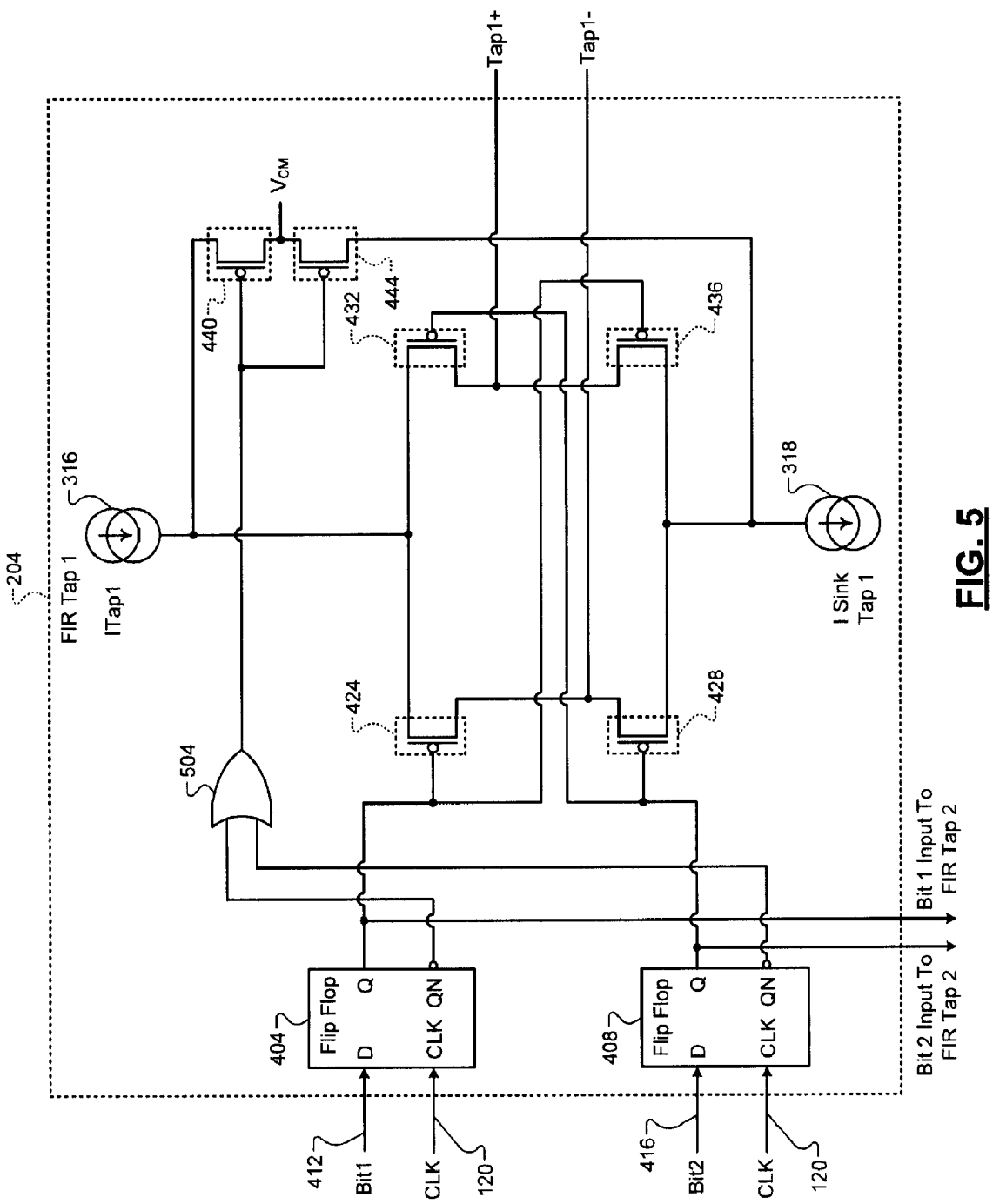

Referring now to FIG. 5, a functional block diagram of another example of the first FIR tap 204 of the DAC 116 is presented. In contrast with the example of FIG. 4, in the example of FIG. 5, the first output of the first flip flop 404 is connected to the control terminals of the first and fourth switches 424 and 436. The first output of the second flip flop 408 is connected to the control terminals of the second and third switches 428 and 432. The second outputs of the first and second flip flops 404 and 408 are connected to first and second inputs of an OR gate 504. The output of the OR gate 504 is connected to the control terminals of the fifth and sixth switches 440 and 444, and the first, second, third, fourth, fifth, and sixth switches 424-444 are P-type MOSFETs. The example of the first FIR tap 204 of FIG. 5 therefore functions the same way as the example of the first FIR tap 204 of FIG. 4. While the examples of FIGS. 4 and 5 have been provided, other combinations of flip flops and logic elements can be used to provide the functionality described above.

Comparing the example of FIG. 3 with the example of FIG. 5, the switch control module 304 may include the first and second flip fops 404 and 408, and the OR gate 504. The first switching module 308 may include the first switch 424, the third switch 432, and the fifth switch 440. The second switching module 312 may include the second switch 428, the fourth switch 436, and the sixth switch 444.

Referring to FIGS. 4 and 5, when the first binary bit 412 is a 0 and the second binary bit 416 is a 1, the first and fourth switches 424 and 436 will be closed and the second and third switches 428 and 432 will be open. The fifth and sixth switches 440 and 444 will also be open. Accordingly, the first tap current 316 will be connected to the negative output of the first FIR tap 204 and the first sink current 318 will be connected to the positive output of the first FIR tap 204 when the first binary bit 412 is a 0 and the second binary bit 416 is a 1.

When the first binary bit 412 is a 1 and the second binary bit 416 is a 0, the second and third switches 428 and 432 will be closed and the first and fourth switches 424 and 436 will be open. The fifth and sixth switches 440 and 444 will also be open. Accordingly, the first tap current 316 will be connected to the positive output of the first FIR tap 204 and the first sink current 318 will be connected to the negative output of the first FIR tap 204 when the first binary bit 412 is a 1 and the second binary bit 416 is a 0.

When the first and second binary bits 412 and 416 are both 1, the first, second, third, and fourth switches 424-436 will be open, and the fifth and sixth switches 440 and 444 will be closed. Accordingly, the first tap current 316 and the first sink current 318 will be disconnected from the positive and negative outputs of the first FIR tap 204 when the first and second binary bits 412 and 416 are both 1.

Referring again to FIG. 1, the conversion control module 122 monitors the digital signal 112. The conversion control module 122 determines whether the digital signal 112 is a 1 bit signal or a 1.5 bit signal. The conversion control module 122 may default to determining that the digital signal 112 is a 1 bit signal. The conversion control module 122 may determine that the digital signal 112 is a 1.5 bit signal in response to the digital signal 112 including a predetermined bit sequence or pattern that is repeated one or more times. The predetermined bit sequence or pattern may be set such that no output signal that is in the DAC passband will be produced, such as 0x66, which may be repeated 32 times or another suitable number of times.

Alternatively, the conversion control module 122 may determine that the digital signal 112 is a 1.5 bit signal in response to the digital signal 112 including an invalid data bit pattern/sequence. As stated above, one of the 4 possible combinations of 2 binary bits can be considered invalid for 1.5 bit operation of the DAC, such as (1,1). As such, the conversion control module 122 may determine that the digital signal 112 is a 1.5 bit signal in response to the digital signal 112 including a bit pattern where the two data bits to be input to a FIR tap are both 1. For example, the invalid data bit pattern/sequence may be 111, 11x11, 11xxx11, 11xxxxx11, and so on, where x is a 1 or a 0.

The conversion control module 122 generates the clock signal 120 based on whether the digital signal 112 is a 1 bit signal or a 1.5 bit signal to enable the DAC 116 to properly parse the digital signal 112. The conversion control module 122 may also set the target current 132 based on whether the digital signal 112 is a 1 bit signal or a 1.5 bit signal. For example, the conversion control module 122 may set the target current 132 to a first predetermined current when the digital signal 112 is a 1 bit signal and set the target current 132 to a second predetermined current when the digital signal 112 is a 1.5 bit signal. The second predetermined current may be less than the first predetermined current.

As stated above, the current source reference generator module 124 generates the current source reference bias voltage 128 based on the target current 132. The current sink reference generator module 134 generates the current sink reference bias voltage 135 based on the target current 132. Changing the current source reference bias voltage 128 (and the current sink reference bias voltage 135) during 1.5 bit operation of the DAC 116 may decrease the analog gain (and allow an increase in the digital gain) during 1.5 bit operation relative to 1 bit operation. Changing the current source reference bias voltage 128 (and the current sink reference bias voltage 135) during 1.5 bit operation may improve the noise output of the DAC 116 by another approximately 1 dB relative to 1 bit operation.

Additionally or alternatively to adjusting the current source reference bias voltage 128 (and the current sink reference bias voltage 135) based on whether the digital signal 112 is a 1 or 1.5 bit signal, the conversion control module 122 may adjust the load resistances 248 and 252 based on whether the digital signal 112 is a 1 or 1.5 bit signal. For example, the conversion control module 122 may set the first and second load resistances 248 and 252 to a first predetermined resistance when the digital signal 112 is a 1 bit signal and set the first and second load resistances 248 and 252 to a second predetermined resistance when the digital signal 112 is a 1.5 bit signal. The second predetermined resistance may be less than the first predetermined resistance. Decreasing the first and second load resistances 248 and 252 during 1.5 bit operation may also improve the noise output of the DAC 116 relative to 1 bit operation.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:
1. A digital to analog converter (DAC) comprising:
first and second nodes;
a first switching device;
a second switching device;

a switch control module that:
   based on a first set of one or two binary bits, configures the first and second switching devices such that the first switching device connects a first current to the first node and the second switching device connects a second current to the second node;
   based on a second set of one or two binary bits, configures the first and second switching devices such that the first switching device connects the first current to the second node and the second switching device connects the second current to the first node; and
   based on a third set of one or two binary bits, configures the first and second switching devices such that the first and second switching devices disconnect the first current and the second current from the first and second nodes;
at least one of:
   a tap current module that generates the first current based on a first reference voltage; and
   a sink current module that generates the second current based on a second reference voltage;
a current source reference generator module that generates the first reference voltage based on a target current;
a current sink reference generator module that generates the second reference voltage based on the target current; and
a conversion control module that sets the target current based on a digital signal input to the DAC.

2. The DAC of claim 1 further comprising:
a third switching device;
a fourth switching device; and
a second switch control module that:
   selectively configures the third and fourth switching devices such that the third switching device connects a third current to the first node and the fourth switching device connects a fourth current to the second node;
   selectively configures the third and fourth switching devices such that the third switching device connects the third current to the second node and the fourth switching device connects the fourth current to the first node; and
   selectively configures the third and fourth switching devices such that the third and fourth switching devices disconnect the third and fourth currents from the first and second nodes.

3. The DAC of claim 1 wherein the first and second currents are substantially equal in magnitude and opposite in polarity.

4. The DAC of claim 1 wherein the conversion control module sets the target current to a first predetermined current when the digital signal is a 1 bit signal and sets the target current to a second predetermined current in response to a determination that the digital signal is a 1.5 bit signal.

5. The DAC of claim 4 wherein the conversion control module determines that the digital signal is a 1.5 bit signal in response to a determination that the digital signal includes a predetermined pattern of binary bits.

6. The DAC of claim 4 wherein the second predetermined current is less than the first predetermined current.

7. A system, comprising:
the DAC of claim 1;
a differential amplifier that includes a first input that is connected to the first node, that includes a second input that is connected to the second node, and that includes first and second outputs;
a first resistance that is connected between the first input and the first output; and
a second resistance that is connected between the second input and the second output.

8. The system of claim 7 wherein the conversion control module selectively varies the first and second resistances based on a digital signal input to the DAC.

9. The system of claim 8 wherein the conversion control module sets the first and second resistances to a first predetermined value when the digital signal is a 1 bit signal and sets the first and second resistances to a second predetermined value in response to a determination that the digital signal is a 1.5 bit signal.

10. The system of claim 9 wherein the second predetermined value is less than the first predetermined value.

11. A system comprising:
a digital to analog converter (DAC) comprising:
   first and second nodes;
   a first switching device that receives a first current at a first terminal and that is connected to the second node at a second terminal;
   a second switching device that is connected to a second current at a first terminal and that is connected to the second node at a second terminal;
   a third switching device that receives the first current at a first terminal and that is connected to the first node at a second terminal;
   a fourth switching device that is connected to the second current at a first terminal and that is connected to the first node at a second terminal;
   a fifth switching device that receives the first current at a first terminal;
   a sixth switching device that is connected at a second terminal to a second terminal of the fifth switching device and that is connected to the second current at a first terminal; and
   a switch control module that, based on first and second bits of binary data:
      generates a first signal that is applied to control terminals of the first and fourth switching devices;
      generates a second signal that is applied to control terminals of the second and third switching devices; and
      generates a third signal that is applied to control terminals of the fifth and sixth switching devices;
a tap current module that generates the first current based on a first reference voltage;
a sink current module that generates the second current based on a second reference voltage;
a current source reference generator module that generates the first reference voltage based on a target current;
a current sink reference generator module that generates the second reference voltage based on the target current; and
a conversion control module that sets the target current to a first predetermined current when a digital signal input to the DAC is a 1 bit signal and sets the target current to a second predetermined current in response to a determination that the digital signal is a 1.5 bit signal.

12. The system of claim 11, wherein the DAC further comprises:
a seventh switching device that receives a third current at a first terminal and that is connected to the second node at a second terminal;
an eighth switching device that is connected to a fourth current at a first terminal and that is connected to the second node at a second terminal;

a ninth switching device that receives the third current at a first terminal and that is connected to the first node at a second terminal;
a tenth switching device that is connected to the fourth current at a first terminal and that is connected to the first node at a second terminal;
an eleventh switching device that receives the third current at a first terminal;
a twelfth switching device that is connected at a second terminal to a second terminal of the eleventh switching device and that is connected to the fourth sink at a first terminal; and
a second switch control module that, based on third and fourth bits of binary data:
generates a fourth signal that is applied to control terminals of the seventh and tenth switching devices;
generates a fifth signal that is applied to control terminals of the eighth and ninth switching devices; and
generates a sixth signal that is applied to control terminals of the eleventh and twelfth switching devices.

13. The system of claim 12 wherein:
the switch control module includes a first flip flop, a second flip flop, and a first logic gate that generate the first, second, and third signals; and
the second switch control module includes a third flip flop, a fourth flip flop, and a second logic gate that generate the fourth, fifth, and sixth signals.

14. The system of claim 13 wherein:
an input of the third flip flop is connected to an output of a first one of the first and second flip flops;
an input of the fourth flip flop is connected to an output of a second one of the first and second flip flops; and
the first and second ones are different.

15. The system of claim 11 wherein the first, second, third, fourth, fifth, and sixth switching devices are metal-oxide semiconductor field-effect transistors (MOSFETs).

16. The system of claim 11 further comprising:
a differential amplifier that includes a first input that is connected to the first node, that includes a second input that is connected to the second node, and that includes first and second outputs;
a first resistance that is connected between the first input and the first output; and
a second resistance that is connected between the second input and the second output.

17. The system of claim 16 wherein the conversion control module sets the first and second resistances to a first predetermined value when a digital signal input to the DAC is a 1 bit signal and sets the first and second resistances to a second predetermined value in response to a determination that the digital signal is a 1.5 bit signal.

18. A system comprising:
a digital to analog converter (DAC) comprising:
first and second nodes;
a first switching device;
a second switching device;
a switch control module that:
based on a first set of one or two binary bits, configures the first and second switching devices such that the first switching device connects a first current to the first node and the second switching device connects a second current to the second node;
based on a second set of one or two binary bits, configures the first and second switching devices such that the first switching device connects the first current to the second node and the second switching device connects the second current to the first node; and
based on a third set of one or two binary bits, configures the first and second switching devices such that the first and second switching devices disconnect the first current and the second current from the first and second nodes;
a differential amplifier that includes a first input that is connected to the first node, that includes a second input that is connected to the second node, and that includes first and second outputs;
a first resistance that is connected between the first input and the first output;
a second resistance that is connected between the second input and the second output; and
a conversion control module that selectively varies the first and second resistances based on a digital signal input to the DAC, wherein the conversion control module sets the first and second resistances to a first predetermined value when the digital signal is a 1 bit signal and sets the first and second resistances to a second predetermined value in response to a determination that the digital signal is a 1.5 bit signal.

19. The system of claim 18 wherein the second predetermined value is less than the first predetermined value.

20. A digital to analog converter (DAC) comprising:
first and second nodes;
a first switching device that receives a first current at a first terminal and that is connected to the second node at a second terminal;
a second switching device that is connected to a second current at a first terminal and that is connected to the second node at a second terminal;
a third switching device that receives the first current at a first terminal and that is connected to the first node at a second terminal;
a fourth switching device that is connected to the second current at a first terminal and that is connected to the first node at a second terminal;
a fifth switching device that receives the first current at a first terminal;
a sixth switching device that is connected at a second terminal to a second terminal of the fifth switching device and that is connected to the second current at a first terminal; and
a first switch control module that, based on first and second bits of binary data:
generates a first signal that is applied to control terminals of the first and fourth switching devices;
generates a second signal that is applied to control terminals of the second and third switching devices; and
generates a third signal that is applied to control terminals of the fifth and sixth switching devices;
a seventh switching device that receives a third current at a first terminal and that is connected to the second node at a second terminal;
an eighth switching device that is connected to a fourth current at a first terminal and that is connected to the second node at a second terminal;
a ninth switching device that receives the third current at a first terminal and that is connected to the first node at a second terminal;
a tenth switching device that is connected to the fourth current at a first terminal and that is connected to the first node at a second terminal;

an eleventh switching device that receives the third current at a first terminal;

a twelfth switching device that is connected at a second terminal to a second terminal of the eleventh switching device and that is connected to the fourth sink at a first terminal; and a second switch control module that, based on third and fourth bits of binary data:
  generates a fourth signal that is applied to control terminals of the seventh and tenth switching devices;
  generates a fifth signal that is applied to control terminals of the eighth and ninth switching devices; and
  generates a sixth signal that is applied to control terminals of the eleventh and twelfth switching devices;

wherein:
  the first switch control module includes a first flip flop, a second flip flop, and a first logic gate that generate the first, second, and third signals; and
  the second switch control module includes a third flip flop, a fourth flip flop, and a second logic gate that generate the fourth, fifth, and sixth signals.

21. The DAC of claim 20 wherein:
an input of the third flip flop is connected to an output of a first one of the first and second flip flops;
an input of the fourth flip flop is connected to an output of a second one of the first and second flip flops; and
the first and second ones are different.

22. A system, comprising:
a digital to analog converter (DAC) comprising:
  first and second nodes;
  a first switching device that receives a first current at a first terminal and that is connected to the second node at a second terminal;
  a second switching device that is connected to a second current at a first terminal and that is connected to the second node at a second terminal;
  a third switching device that receives the first current at a first terminal and that is connected to the first node at a second terminal;
  a fourth switching device that is connected to the second current at a first terminal and that is connected to the first node at a second terminal;
  a fifth switching device that receives the first current at a first terminal;
  a sixth switching device that is connected at a second terminal to a second terminal of the fifth switching device and that is connected to the second current at a first terminal; and
  a switch control module that, based on first and second bits of binary data:
    generates a first signal that is applied to control terminals of the first and fourth switching devices;
    generates a second signal that is applied to control terminals of the second and third switching devices; and
    generates a third signal that is applied to control terminals of the fifth and sixth switching devices;
  a differential amplifier that includes a first input that is connected to the first node, that includes a second input that is connected to the second node, and that includes first and second outputs;
  a first resistance that is connected between the first input and the first output;
  a second resistance that is connected between the second input and the second output; and
  a conversion control module that sets the first and second resistances to a first predetermined value when a digital signal input to the DAC is a 1 bit signal and that sets the first and second resistances to a second predetermined value in response to a determination that the digital signal is a 1.5 bit signal.

* * * * *